(12) United States Patent
Miliotis

(10) Patent No.: US 10,419,019 B2
(45) Date of Patent: Sep. 17, 2019

(54) DATA COMPRESSION SYSTEM

(71) Applicant: CHAOLOGIX, INC., Gainesville, FL (US)

(72) Inventor: Abraham Miliotis, Johnstown, PA (US)

(73) Assignee: CHAOLOGIX, INC., Gainesville, FL (US)

( * ) Notice: Subject to any disclaimer, the term of this patent is extended or adjusted under 35 U.S.C. 154(b) by 0 days.

(21) Appl. No.: 15/770,814

(22) PCT Filed: Nov. 13, 2016

(86) PCT No.: PCT/US2016/061732
§ 371 (c)(1),
(2) Date: Apr. 25, 2018

(87) PCT Pub. No.: WO2017/083797
PCT Pub. Date: May 18, 2017

(65) Prior Publication Data
US 2018/0323799 A1 Nov. 8, 2018

Related U.S. Application Data

(60) Provisional application No. 62/254,803, filed on Nov. 13, 2015.

(51) Int. Cl.
H03M 7/30 (2006.01)
G06F 3/06 (2006.01)
H03K 19/20 (2006.01)

(52) U.S. Cl.
CPC ............ *H03M 7/30* (2013.01); *G06F 3/0608* (2013.01); *G06F 3/0659* (2013.01); *G06F 3/0661* (2013.01); *G06F 3/0673* (2013.01); *H03M 7/3097* (2013.01); *H03M 7/55* (2013.01); *H03K 19/20* (2013.01)

(58) Field of Classification Search
None
See application file for complete search history.

(56) References Cited

U.S. PATENT DOCUMENTS

| 5,486,826 A | 1/1996 | Remillard |
| 7,215,776 B1 * | 5/2007 | Short ...................... H04L 9/001 380/263 |
| 7,863,937 B2 | 1/2011 | Ditto et al. |
| 7,973,566 B2 | 7/2011 | Ditto et al. |
| 8,250,055 B2 | 8/2012 | Ditto et al. |

(Continued)

OTHER PUBLICATIONS

Ogorzatek, Approximation and Compression of Arbitrary Time-Series Based on Nonlinear Dynamics, IEEE (Year: 2001).*

(Continued)

*Primary Examiner* — Howard Williams
(74) *Attorney, Agent, or Firm* — Talem IP Law, LLP

(57) ABSTRACT

A data compression system can include a compression unit comprising a single chaotic system having an identified initial condition that produces a desired output sequence of data corresponding to a data set being stored. The single chaotic system can be identified using a chain of controlled nonlinear systems and a dynamical search technique to match the output, in sequence over consecutive time intervals with the chain of the controlled nonlinear systems.

10 Claims, 6 Drawing Sheets

(56) References Cited

U.S. PATENT DOCUMENTS

2003/0169940 A1* 9/2003 Short ................... G10H 1/0041
382/249
2005/0172154 A1 8/2005 Short et al.
2006/0269057 A1* 11/2006 Short ..................... G10L 25/48
380/228

OTHER PUBLICATIONS

Ogonatek, Signal Coding and Compression Based on Discrete-Time Chaos: Statistical Approaches, (Year: 2002).*

Glenn et al., A New Digital Image Compression Algorithm Based on Nonlinear Dynamical Systems, Rochester Institute of Technology RIT Scholar Works, (2005). Accessed from http://scholarworks.rit.edu/other/791 (Year: 2005).*

Burak, D "Parallelization of an Encryption Algorithm Based on a Spatiotemporal Chaotic System and a Chaotic Neural Network"; ICCS 2015 International Conference on Computational Science, vol. 51; Publication [online]. 2015 [retrieved Feb. 24, 2017]. Retrieved from the Internet: <URL: www.sciencedirect.com/science/article/pii/S18770509-15012612>; pp. 2888-2892.

"International Search Report and Written Opinion Issued in PCT Application No. PCT/US16/61732", dated Mar. 16, 2017, 15 Pages.

\* cited by examiner

DATA COMPRESSION SYSTEM

CROSS-REFERENCE TO RELATED APPLICATIONS

This application is the U.S. National Stage Application of International Application No. PCT/US16/61732, filed Nov. 13, 2016, which claims the benefit of U.S. Provisional Application Ser. No. 62/254,803, filed Nov. 13, 2015.

BACKGROUND

More and more data is being stored, requiring ever-increasing data storage facilities and necessitating that new techniques, including compression, be developed for reducing the storage device burden currently associated with the storage of data files. Conventionally, to store more data in a set sized space, data compression algorithms are used to reduce the number of bits stored in a memory device.

BRIEF SUMMARY

A data compression system and method of performing data compression and storage are provided. In certain implementations, a single chaotic system provides a data compression unit that effectively stores a sequence of data. The compression of the data can be carried out by identifying an initial condition for a chaotic system that produces the sequence of data. This initial condition for the chaotic system, and therefore an appropriate chaotic system for providing the data compression unit, can be identified by using a controlled chain of nonlinear systems, where each nonlinear system represents a data segment of the sequence of data. The representation of the data segment can be a result of holding the nonlinear system at an initial condition complimentary to the output of the chaotic system. The output of the chaotic system is matched using a dynamical search technique, in sequence over consecutive time intervals, to the data segments represented by the chain of nonlinear systems from a first of the nonlinear systems to a last of the nonlinear systems.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DISCLOSURE

Figure 1:
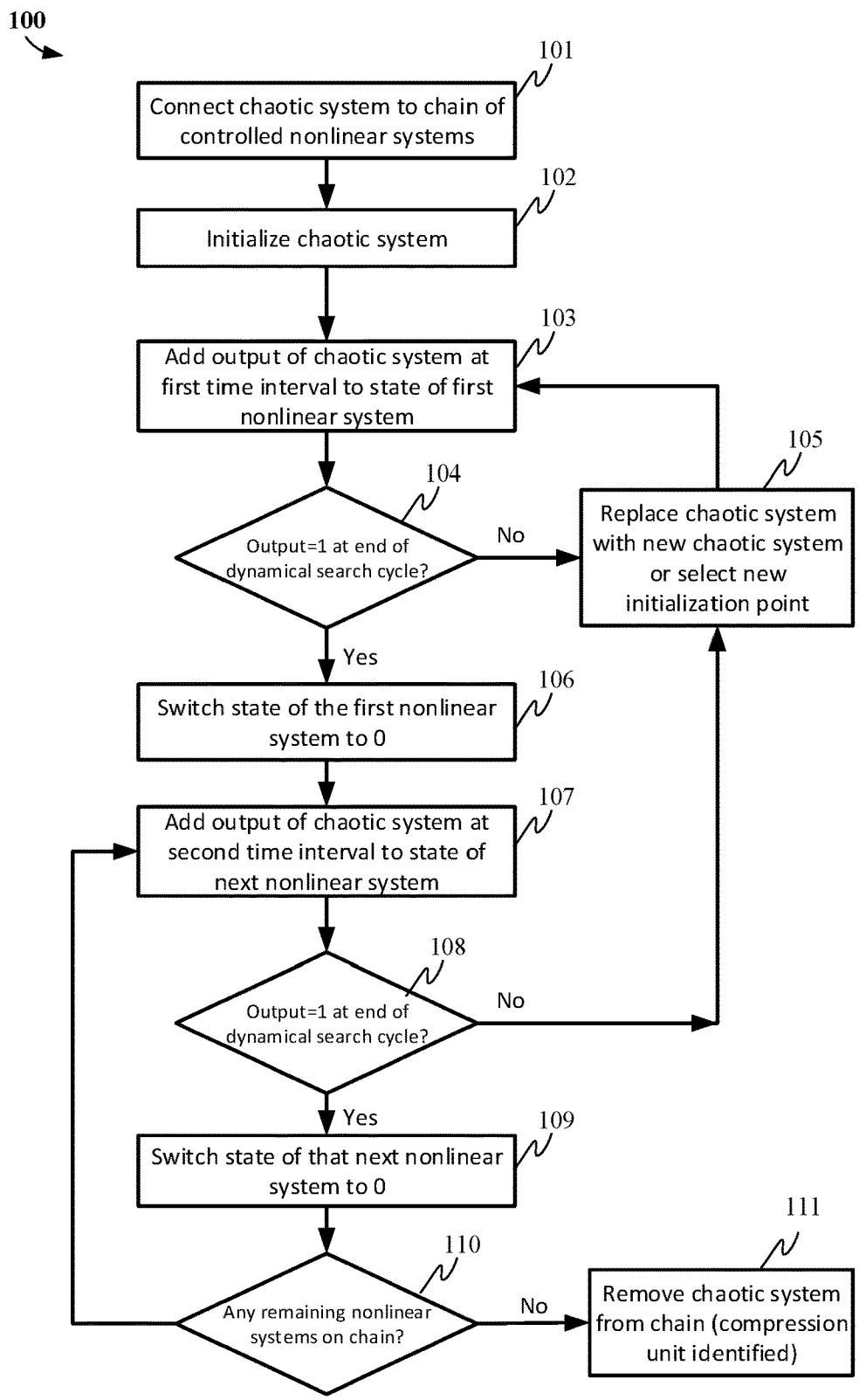
FIG. 1 shows a process flow diagram for identifying an appropriate compression unit for storing a data set.

A data compression system and method of performing data compression and storage are provided. A chaotic system with the appropriate initial condition to generate a representation of a set of data can effectively be considered to store that set of data in a compressed manner since a single system or 'unit' can store a data sequence.

Chaotic systems have a property that their behavior can be from a set of an infinite number of different behaviors. These behaviors are essentially progressions from one point to another point over time; where a point is the state of the system at a given moment in time. For example, in the case of certain electronic-based chaotic systems (e.g., silicon—CMOS—realizations), this state of the system at a given moment in time can be can be a voltage (and an associated voltage level). In the electronic-based chaotic systems, each voltage level can be associated with a specific datum (piece of information). For example, an entire metadata database could be stored using a chaotic system, and each datum of the metadata database can be represented by a voltage value at a given moment in time.

With an infinite number of different behaviors possible, a single chaotic system can potentially produce any desired behavior. As described herein, a single chaotic system can be identified that produces a desired behavior (e.g., a desired sequence of states over time, where each state represents a datum) of a set of data, and such system can be used as a data compression unit for the set of data.

In a memory device, such as a hard drive or random access memory (RAM), each datum in a sequence is stored at a specific spatial (e.g., physical) location on the device, for example, by using multiple transistors to store each datum. A chaotic system can store long sequences of data in time rather than in space such as is the case of the memory device. The reading out of data over time is sufficient because even in a conventional memory device, a data sequence is very rarely accessed in parallel (e.g., requested at the same time). Instead, data is generally read in batches from the memory device during a read cycle. Therefore, reading out a sequence over time from a chaotic system can have minimal impact on computing systems receiving the data.

With respect to writing data (e.g., to store the data), instead of a classic "write" operation, a chaotic system implementing the compressed storage is identified through application of a dynamical search algorithm. The dynamical search algorithm can identify the right initial conditions for the chaotic system such that the chaotic system behaves in a desired manner to represent the sequence of data.

Once the right initial conditions are found for a chaotic system to produce a behavior that at each time step is at the required point that represents the data, a very long sequence of data can be considered "stored" by that chaotic system, with the expectation that each point of data can be output at one time-step at a time. Thus, once identified, the chaotic system can produce the data sequence each instance the system is accessed.

Accordingly, a single chaotic system, can be used to "store", or generate, long sequences of data. This single chaotic system provides a "compression unit". For electronic-based implementations, a single chaotic system can store, for generating, a sequence of data with a minimal number of transistors. Thus, a single, small system, which can be implemented using transistors, can produce sequences of data that represent collections of the represented data to be stored.

Through use of the described identified chaotic systems, data can therefore be stored for later retrieval in a compressed manner, reducing storage requirements at data centers and other storage resource locations. Indeed, a chaotic system can store a sequence of data with just enough transistors to create the chaotic system. That is, the number of transistors used in the chaotic system is not dependent on the amount of data to be stored. This configuration enables the set of data to be stored in a manner taking up less physical space than conventional storage.

FIG. 1 shows a process flow diagram for identifying an appropriate compression unit for storing a data set. FIGS. 2A-2E show representational diagrams of an example implementation of a process of identifying an appropriate compression unit for storing a data set.

Figure 5:
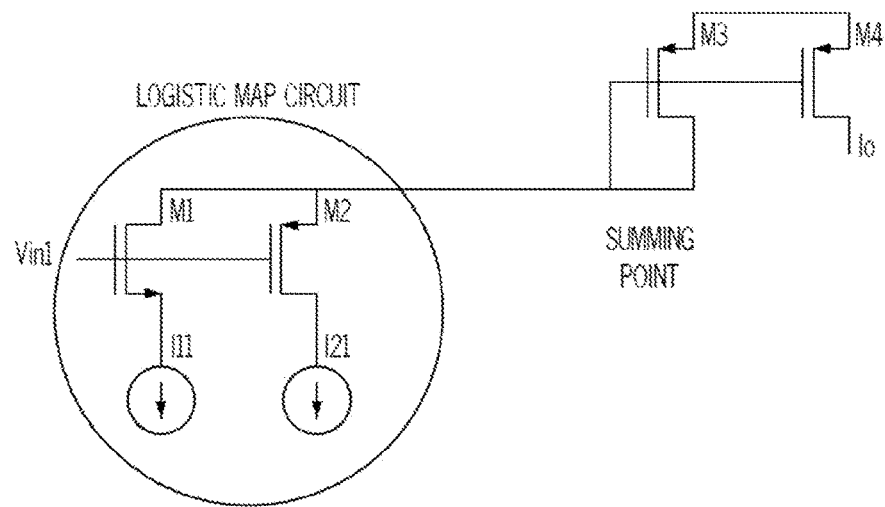
FIG. 5 shows an example implementation of a chaotic system.

Referring to FIG. 1, a process for identifying an appropriate compression unit for storing data 100 can begin by connecting a chaotic system to a chain of controlled non-linear systems (101). The chaotic, or dynamical, system can be embodied in any suitable manner including fluid, electronic, or optical systems and can implement any suitable dynamical or chaotic map including, but not limited to a logistic map or a tent map. An example of an electronic-based chaotic system is shown in FIG. 5, which shows a logistic map circuit.

Figure 2A:
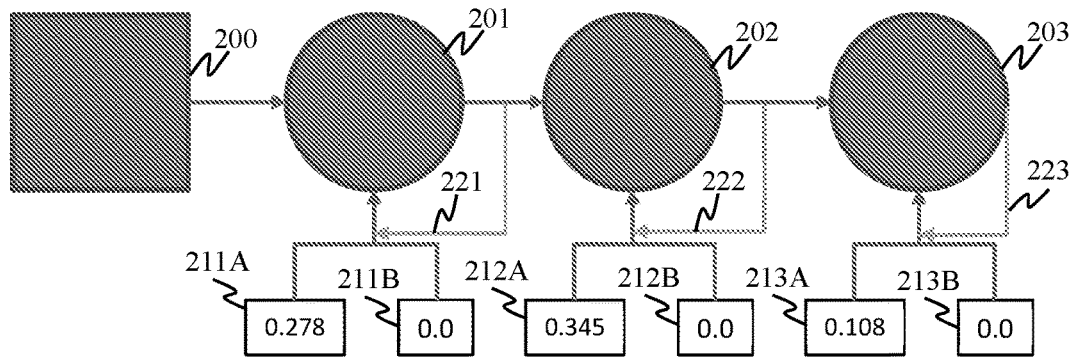
FIGS. 2A-2E show representational diagrams of an example implementation of a process of identifying an appropriate compression unit for storing a data set.

An example configuration where a chaotic system is connected to a chain of controlled nonlinear systems is shown in FIG. 2A, where a single non-controlled chaotic system 200 is connected to a chain of three controlled nonlinear systems 201, 202, and 203. It should be noted that the chaotic system 200 and the nonlinear systems 201, 202, 203 can be completely different types of systems (e.g., other types of systems); and not only that one is non-controlled and the other is controlled (e.g., is maintained at a particular threshold). For example, the nonlinear systems are not required to be chaotic, only that they have a folding behavior. However, in one implementation described herein, one or more of the nonlinear systems are implemented as a logistic map circuit and the chaotic system is implemented as a logistic map circuit (an example logistic map circuit being illustrated in FIG. 5).

Returning to the process 100 of FIG. 1, the chaotic system 200 can be initialized (102). The initializing of the chaotic system can correspond to selecting a point in time or space from which the output of the chaotic system is to be used. The chaotic system can be initialized at some point in space, preferably away from already known orbits. Known orbits refer to initial conditions that produce known outputs. The chaotic system is allowed to evolve freely, but (its output) is identified by monitoring its state. The output of the chaotic system can then be passed to the chain of controlled non-linear systems (e.g., systems 201, 202, 203) to perform a matching process using a dynamical search technique, which is also described in more detail with respect to FIG. 4.

Figure 6:
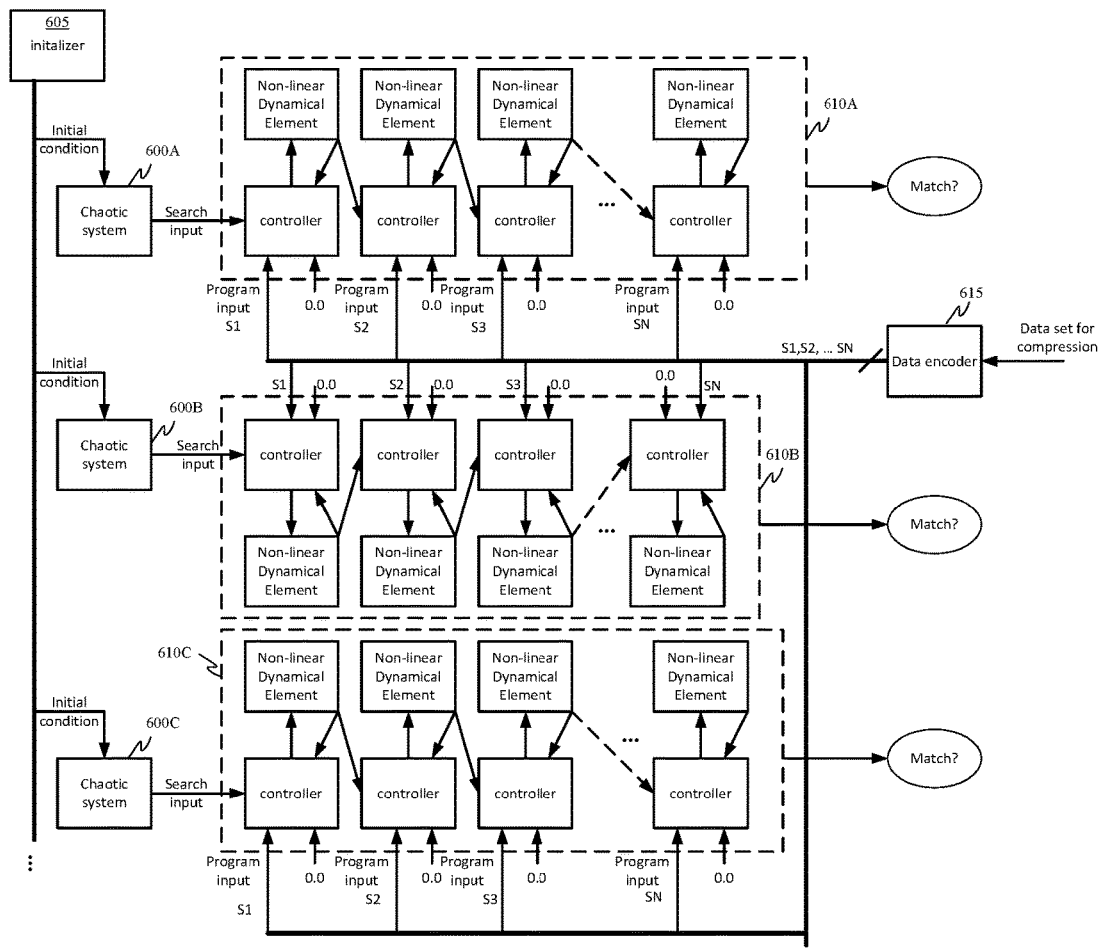
FIG. 6 shows a representational diagram of a configuration to identify an appropriate compression unit for storing a data set.

Identifying the initial conditions for the chaotic system can be accomplished through trial and error. To find when the chaotic system can produce the appropriate output representing a desired sequence of data (the initial condition), the chaotic system can be parallelized in space or in time or both. That is, as illustrated in FIG. 6, there can be many rows of candidate uncontrolled chaotic systems with chains of controlled nonlinear systems like that shown in FIG. 2A, where each candidate chaotic system begins with a different initial condition so that if/when a candidate is determined to not be the appropriate compression unit (such as could occur at operations 104 and 108), the initial conditions can be changed and the process started again (such as indicated by operation 105). Eventually this "brute force" approach can identify the candidate chaotic system with the behavior desired for the compression unit.

In more detail, with reference to FIG. 6, a plurality of chaotic systems (e.g., 600A, 600B, 600C) are parallelized in space or time (or both). These chaotic systems are candidate systems that begin with different initial conditions, which may be controlled, for example, via an initializer 605 (which can have logic or circuitry to generate or receive initial conditions and apply such conditions to the plurality of chaotic systems). The outputs of the chaotic systems (e.g., 600A, 600B, 600C) can be provided as search input to corresponding chains of non-linear systems (e.g., 610A, 610B, 610C), which may be implemented as illustrated in FIG. 2A and/or FIG. 4 (with nonlinear dynamical element and controller) to carry out a dynamical search technique.

For the dynamical search technique, the chain of controlled chaotic systems (e.g., 610A, 610B, 610C) are each at an initial condition complementary to the required point in space desired to be incoming from the non-controlled system implementing the compression unit. For instance, in the example shown in FIG. 2A, the three controlled nonlinear systems 201, 202, and 203 are each encoded with a data point, which may be a threshold value that confines the nonlinear system on a fixed point and uniquely encodes the information item it holds. As illustrated in FIG. 6, a data encoder 615 can receive a data set for compression and generate the appropriate initial condition program input for the chain of nonlinear systems. For example, a sequence of S1, S2, S3, . . . SN (where N is a number of data points in the data set) can be generated and provided as program input to the chain. In the parallelized configuration of FIG. 6, each chain is provided with the same program inputs.

In the illustrative example of FIGS. 2A-2E, the first nonlinear system 201 has an encoded data point of 0.278, provided as program input 211A; the second nonlinear system 202 has an encoded data point of 0.345, provided as program input 212A; and the third nonlinear system 203 has an encoded data point of 0.108, provided as program input 213A.

These values can, for example, be encoding the word "THE", where T is represented by 0.278, H is represented by 0.345, and E is represented by 0.108. In this case, the desired input to the chain of nonlinear systems (that is output by the chaotic system 200), is the complementary sequence 0.222, 0.155, and 0.392. It should be understood that the chain of nonlinear systems encode the data complementary to the value space that the chaotic system forming the compression unit is to operate. Therefore, 0.222, 0.155, and 0.392 represent "THE", but are encoded for the dynamical search technique as 0.278, 0.345, and 0.108.

To facilitate the implementation of the process of identifying a compression unit for a sequence of data corresponding to a data set being "stored", each of the controlled nonlinear systems includes a 0 state input (211B, 212B, and 213B). When one of the systems on the chain (e.g., 201, 202 or 203) registers a "1", indicating that the output of the non-controlled system matches the point represented by the controlled chaotic system, a control value is switched (using switch control 221, 222, or 223) from the required datum state provided by the program input to "0" from the 0 state input. The application of the 0 state results in that nonlinear system becoming able to propagate the signal from the non-controlled system to the next nonlinear system on the chain without adversely affecting the signal. The matching process is iterated from the first system all the way to the end.

Figure 2B:
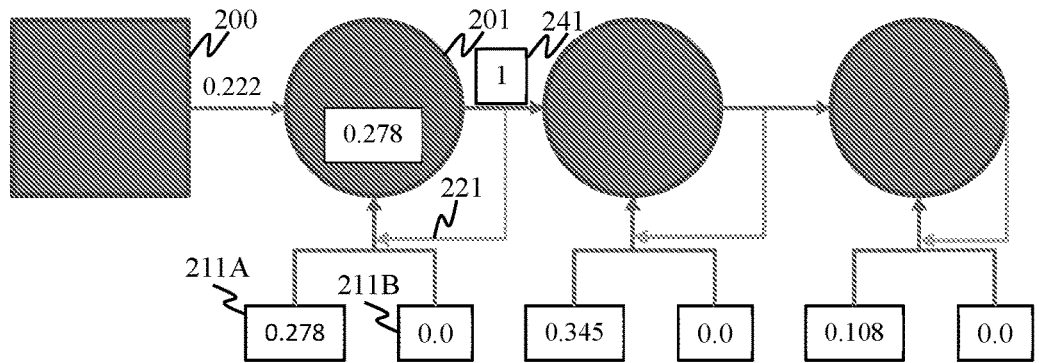

In more detail, as shown in FIGS. 1 and 2B, the output of the chaotic system 200 at the first time interval from the initialization point is added to the state of the first nonlinear system 201 (103). A match occurs when adding these two values give 0.5 (a pivot point), which is the case here when the output is 0.222. Within this matching process, a value of 0.5 results in an output 241 of a maximal value of "1" (or some other predefined maximal value). Accordingly, the output condition of the first nonlinear system 201 is evaluated (104). If the output is not equal to 1, then the candidate chaotic system 200 is replaced in the chain with another system or a new initialization point is selected (105). The process then begins again from operation 103. If the output is equal to 1 during the evaluation of operation 104, the state of the first nonlinear system 201 is switched to 0 (106), for example, by switch control 221 causing the 0 state input 211B to control the state of the first nonlinear system 201.

The output of the chaotic system 200 at the next time interval (e.g., after outputting the value 0.222) is then added to the state of the next nonlinear system (107); and the output condition of this next nonlinear system is evaluated (108) to determine whether the chaotic system is to be replaced/new initialization point selected (105) or the state of that next nonlinear system is switched to 0 (109), indicating that a match occurred. If there are any additional nonlinear systems on the chain (e.g., evaluated at operation 110), the process repeats operations 107, 108, and 109 until there are no further nonlinear systems to match. At this time, the chaotic system can be removed from the chain and identified as the compression unit for the desired data set (111).

Figure 2C:
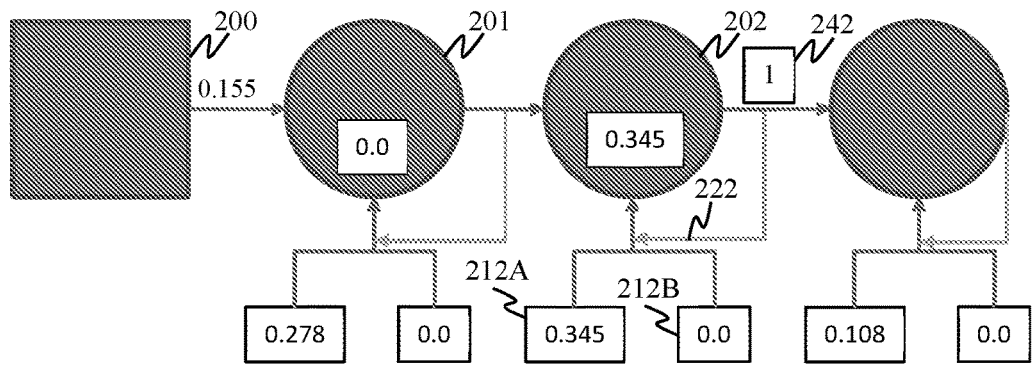
Figure 2D:
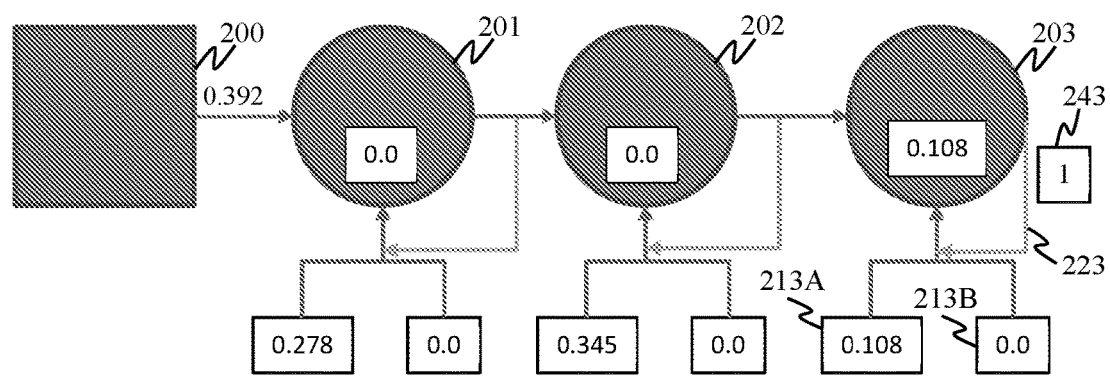
Figure 2E:
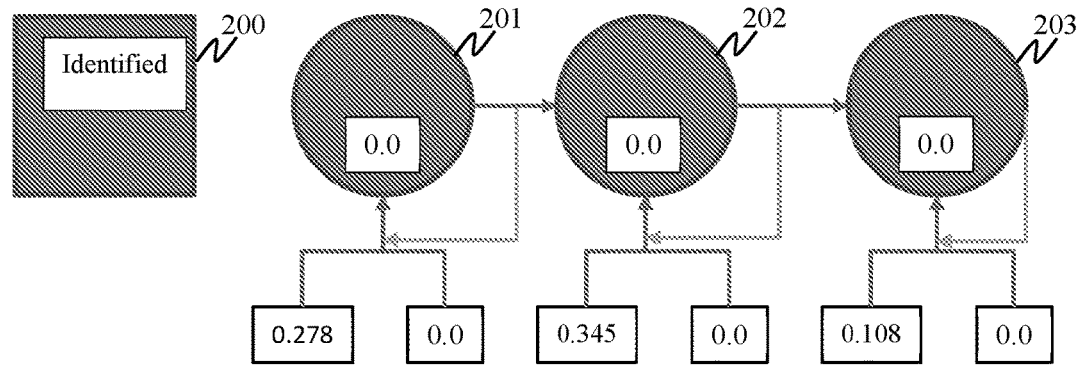

For example, as shown in FIG. 2C, the first nonlinear system 201 has a state of 0. Therefore, the second time interval output of 0.155 from the chaotic system 200 passes through the first nonlinear system 201 to the second nonlinear system 202 and is added to the 0.345 state of the second nonlinear system 202. Since 0.155+0.345 add up to 0.5, the dynamical search technique results in an output 242 of a 1, which in turn switches (via switch 222) the input state of the second nonlinear system 202 from 0.345 to 0 as shown in FIG. 2D. Also illustrated in FIG. 2D is the third time interval output from the chaotic system 200. Here, the output of 0.392 passes through the first nonlinear system 201 and the second nonlinear system 202 to be used to determine whether its value "matches" that of the third nonlinear system 203. Here, since 0.392+0.108=0.5, the dynamical search technique results in an output 243 of 1, switching (via switch 223) the third nonlinear system 203 to a 0 state as reflected in FIG. 2E. Since the outputs of the chaotic system 200 from this particular initial condition resulted in matching all the way through the chain of nonlinear systems 201, 202, 203, the chaotic system 200 is identified as the compression unit for 0.278, 0.345, 0.108, which represents in this example T-H-E. The chaotic system 200 can thus be disconnected from the chain and subsequently used as needed to generate data representing T-H-E.

Figure 3A:
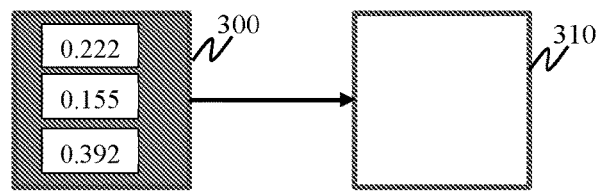
FIGS. 3A and 3B show a representational diagram and process, respectfully, of reading data from a compression unit identified according to the example process shown in FIGS. 2A-2E.
Figure 3B:
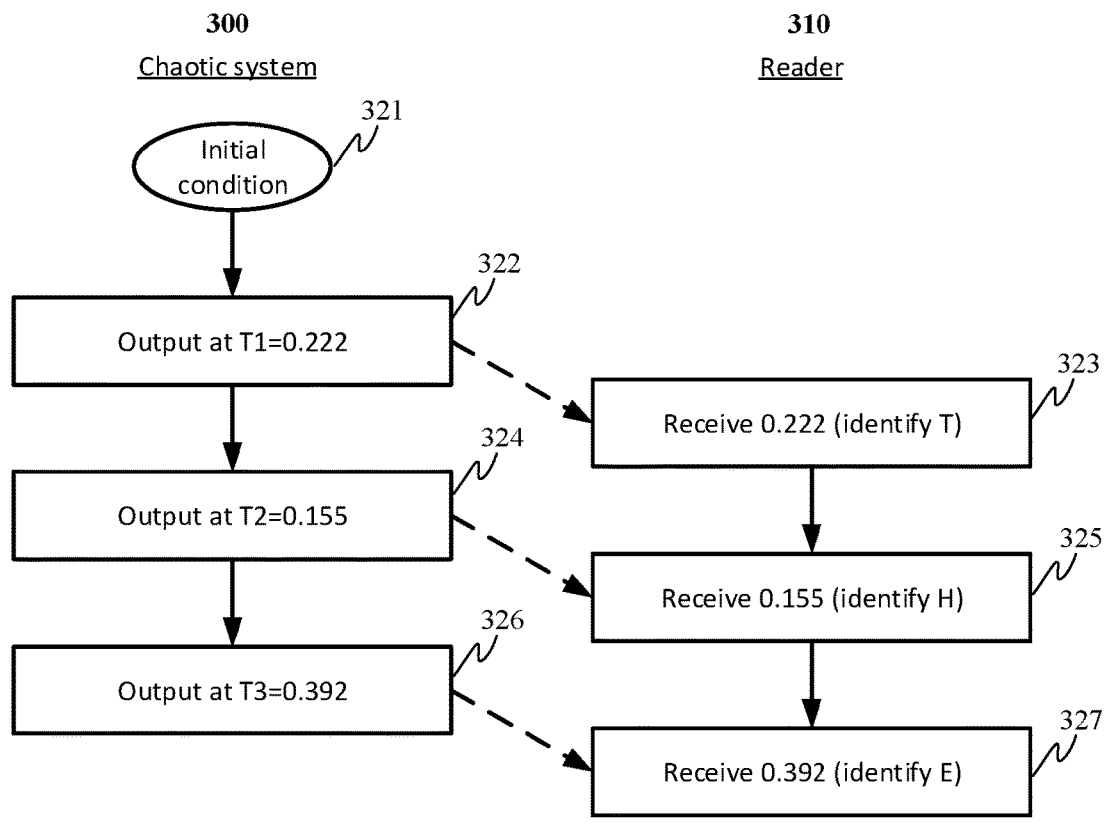

Once identified using the chain of nonlinear systems and dynamical search technique, the chaotic system can be considered to store, in compressed form, the data, and can be accessed to recover that data. FIGS. 3A and 3B show a representational diagram and process, respectfully, of reading data from a compression unit identified according to the example process shown in FIGS. 2A-2E. For example, as shown in FIGS. 3A and 3B, the output of the chaotic system 300 can be read by a reader 310. Chaotic system 300 can be initialized (321) with the initial condition as identified by the process completed at FIG. 2E and at time T1, the chaotic system outputs 0.222, representing the first letter in the word "THE" (322), which is then received by the reader (323). This process continues in two consecutive time steps to complete the word. For example, at time T2, the chaotic system outputs 0.155 (324), which is then received by the reader (325) and then at time T3, the chaotic system outputs 0.392 (356), which is then received by the reader (327).

Figure 4:
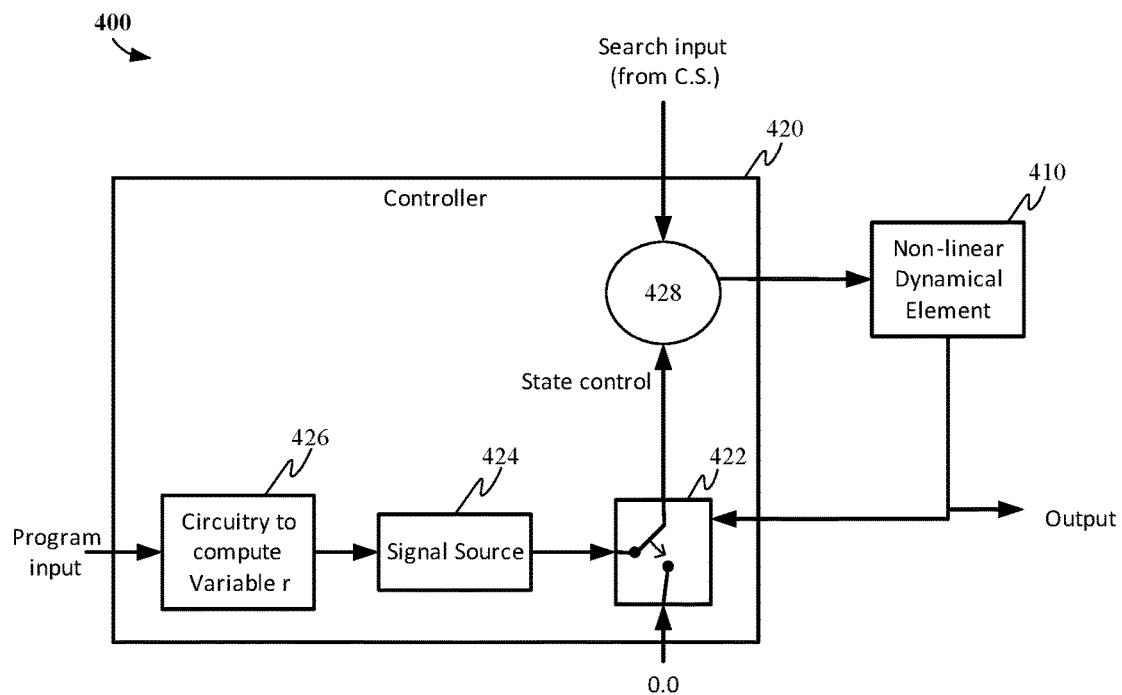
FIG. 4 shows representational components for implementing an example dynamical search technique that can be used to identify a compression unit.

FIG. 4 shows representational components for implementing an example dynamical search technique that can be used to identify a compression unit. Referring to FIG. 4, a dynamical search component 400 can include a nonlinear dynamical element 410 and a controller 420. The controller can include a control switch 422, a signal source 424, and circuitry 426. The dynamical search element receives a program input, a 0 state input, and a search input (which can be from a chaotic system such as chaotic system 200) and outputs a value that can be fed back to the controller 420 as well as on to a next dynamical search component. A summing point 428 can receive a state control from the signal path controlled by switch 422 and the search input from the chaotic system (directly or after the search input passes through the non-linear dynamical element 410 and is output to the next nonlinear system in the chain). Dynamical search component 400 can be used to implement each of the chain of nonlinear systems. For example, nonlinear dynamical element 410 can implement nonlinear system 201 with controller 420 handling encoding of the nonlinear system 201 as well as switch control 221.

The nonlinear dynamical element 410, according to one embodiment, can comprise a chaotic logic gate having a circuit architecture as described in U.S. Pat. No. 7,096,437, which is hereby incorporated by reference in its entirety to the extent that it is not inconsistent with the description herein. As another example, the nonlinear dynamical element 410 may comprise a logistic map such as described with respect to FIG. 5.

The nonlinear dynamical element 410 can use a threshold value (analog or digital) to confine its state on a fixed point that can uniquely encode an information item (e.g., a data segment). The controller 420 controls electrical signals that are supplied to the nonlinear dynamical element 410, for example, in a predetermined sequence. The controller 420 can, depending on implementation, control the amount and/or timing of one or more electrical signals, such as voltage or current. As described below, an applied electrical signal can increase a state value of the nonlinear dynamical element 410 by a quantity defining a search input key that corresponds to a searched-for information item. A subsequently applied electrical signal can update the state value of the nonlinear dynamical element 410 by performing a nonlinear folding of the state value based on a predetermined pivot, as also described below.

The information stored in the nonlinear system can be encoded using a threshold mechanism on the nonlinear element in the system. More particularly, in this example, the encoding proceeds as follows: whenever the value of a prescribed state variable of the dynamical element exceeds a prescribed critical threshold $x^*$ (i.e. when $x>x^*$) the variable x is re-set to $x^*$. Thresholding according to the encoding scheme actually works as a control mechanism, and a wide range of stable regular behaviors are obtained from chaotic dynamical systems under this thresholding.

The nonlinear dynamical element 410 can be encoded based on various schemes that exhibit the properties of a nonlinear dynamical system. One exemplary scheme is based on a unimodal map. An encoding scheme based on one example of a unimodal map, e.g., a tent map, is described immediately below. It should be noted that an encoding scheme based on a tent map is merely illustrative and should not indicate that the encoding scheme is limited to such a map.

In particular, a nonlinear element may, as illustration, evolve according to a chaotic tent map, defined on the interval [0, 1]: $x_{n+1}=2 \min(x_n, 1-x_n)$. An element has a threshold value that confines it on a fixed point and uniquely encodes the information item it holds. With respect to the stated map, thresholds ranging from 0 to ⅔ yield fixed points with the variable x held at x*. This can be seen from the fact $f(x^*)>x^*$ for all x* in the interval (0, ⅔), implying that, on iteration, a state at x* will always exceed x*, and thus be reset to x*.

According to this encoding scheme, a threshold can be chosen from the interval (0, ½). A variable, r, is defined as follows:

$$r = \frac{1}{2} \cdot \frac{1}{I_{max}+1}. \quad (1)$$

The value or quantity, r, determines the resolution. $I_{max}$ refers to a maximum positive integer, and is based on describing the nonlinear element (e.g., the nonlinear dynamical system) as a database in which the information items are positive integers contained within the range of [1, Imax]. The value or quantity, r, further yields a lookup map from the encoded number z to the threshold $x^*_z$. The resulting map connects the positive integers, z, within the range $[1, I_{max}]$, to the irrational numbers, $x^*_z$, of the interval (0, ½) according to the following relationship:

$$x^*_z = z \cdot r \quad (2)$$

such that the thresholds are contained in the interval [r, ½-r]. It can be seen from Eq. (1) that if the threshold setting has more resolution, namely a smaller r, then a larger range of values can be encoded with each element.

It should be understood that different representations of data can be chosen in order to suit a given precision of thresholding.

The controller 420 can include processing circuitry 426 comprising dedicated hardwired circuitry and/or logic-based circuitry for processing machine-readable code that computes the variable r according to equation (1), above, and then determines the corresponding thresholds, $x^*_z$, for each of the various positive integers, $z \in [1, I_{max}]$, one or more of which are used for the nonlinear dynamical element 410, and which are based on the computed r according to equation (2), above. The positive integers, $z \in [1, I_{max}]$, can be supplied to the controller 420 via a user input device or via one of various other digital or analog electronic input devices. In some cases, the circuitry 426 is not included as part of the controller 420, and instead is provided in a computing system that may provide inputs to the larger system as a whole.

The controller 420 further illustratively includes a signal source 424, such as a voltage or current source, that applies electrical signals to the nonlinear dynamical element 410 in order to encode the element with the appropriate program input (for the sequence data). Specifically, the electrical signals supplied by the signal source 424 are such that the nonlinear dynamical element 410 possesses a threshold $x^*_z$ that corresponds to the z value that it encodes.

The controller 420 further includes a control switch 422 that can select the electrical signal applied to the nonlinear dynamical element 410.

Identification of an item in a sequence of items for a chaotic system representing a stored sequence of items is performed by increasing the state value of the nonlinear dynamical element 410 by an amount uniquely corresponding to the item searched for, namely by a search input value ($S_{key}^z$). The search technique can be based on the non-linear dynamical search engine described in U.S. Pat. No. 8,250,055, which is incorporated by reference herein in its entirety to the extent that it is not inconsistent with the description herein.

The state value of the nonlinear dynamical element 410 can be increased by applied electrical signals controlled by the controller 420, as already described. The matching search input value, $S_{key}^z$, is defined by the following equation:

$$S_{key}^z = \frac{1}{2} - x^*_z = \frac{1}{2} - z \cdot r \quad (3)$$

where z is the number for which the "database" provided by the nonlinear dynamical element 410 is searched. Specifically, $S_{key}^z$ is added to the nonlinear dynamical element 106. Where there are more than one nonlinear dynamical elements in the nonlinear system, the result is a shift of the interval that the nonlinear dynamical elements can span, from [r, ½-r] to $[r+S_{key}^z, \frac{1}{2}-r+S_{key}^z]$, where $S_{key}^z$ represents the globally applied shift.

It should be further noted that the information item being searched for, is coded in a manner complimentary to the encoding of the information items in the nonlinear systems (much like a key that fits a particular lock), namely $S_{key}^z + x^*_z$ adds up to ½. This guarantees that only an item matching the one being searched for will have its state shifted to ½. The value of ½ is notable in that it is the only state value that, on the subsequent update, will reach the value of 1.0, which can be considered a preferred maximum state value. Thus only the matching items will reach 1.0 after the search operation is performed.

A unique characteristic of the point ½ is that it acts as pivot point for the folding that occurs on the interval $[r+S_{key}, \frac{1}{2}-r+S_{key}]$ upon the next update. This provides a global monitoring operation for confirmation of the existence of any specified information item.

The detection of the state value of a nonlinear dynamical element 410 can be accomplished in different ways. According to one embodiment a threshold-response-triggered detector (not shown), triggered for example by the element taking on a state value 1.00, can be utilized.

Since the search operation only alters the states of the maps, the thresholds that defined the actual data stored in each map remain unaltered and can function as a mechanism to restore the original database.

The search method utilizes the fact that a region of the tent map, [⅓, ⅔], is folded around its midpoint, ½, and then stretched and translated into the region [⅔, 1] after one iteration of the map. As a result, the point 0.5 is the sole point mapped onto 1.0, which is the maximum possible state value for the map. The search operation entails shifting the interval encoding the database by an amount that shifts the matching item(s) onto the pivot point 0.5. The subsequent dynamical update will then take only the matching item(s) to the value of 1.0.

As the description and representative examples demonstrate, the nonlinear evolution of the state values result in folding and the identification of a matched item can be entirely based on this feature. Chaos, or specifically the properties of a chaotic system, is not strictly necessary. It is evident though, that for unimodal maps higher enhance the resolution in the encoding. For the tent map, specifically, it can be shown that the minimal nonlinearity necessary for the above-described search operation to work, the operation is performed in the chaotic region. Another specific feature of the tent map is that its piecewise linearity allows the encoding and search key operation to be straightforward.

Any nonlinear system may be sufficient and can encompass many different physical systems, ranging from fluids to electronics to optics.

As described above, the chaotic system and even the nonlinear system can include one or more nonlinear elements. An example chaotic element (that may form the nonlinear element) is based on a logistic mapping function, f(x) as described in U.S. Pat. No. 7,096,437, the teachings of which are hereby incorporated hereinto by reference in their entirety to the extent that such teachings are not inconsistent with the description herein. In U.S. Pat. No. 7,096,437, the logistic mapping function is based on a function $f_1(x)$, where $f_1(x)=4ax(1-x)$ with a=1. Chaos is introduced by limiting the value $f_1(x)$ may take. For example, should $f_1(x)$ ever exceed a threshold x*, say x*=0.8, then $f_1(x)$ is set to equal the threshold value. Mathematically, the control of the chaotic function f(x) may be expressed as $$f(x)=f_1(x) \text{ if } f_1(x)<x^*, x^* \text{ if } f_1(x)>x^* \quad (4)$$

$$f_1(x)=4x(1-x). \quad (5)$$

Chaos is demonstrated by plotting the value of f(x) vs. x. This is referred to as the first iterate of the chaotic function f(x). If the result of this calculation is then used as the input to the chaotic function, then this is referred to as the second iterate. Again, mathematically this is represented as the second iterate, g(x), defined as $$g(x)=f(f(x)). \quad (6)$$

The chaotic element based on the logistic map circuit includes a specific chaotic mapping function that is consistent with integrated circuit MOSFET characteristics, in particular the current-voltage characteristics of a MOSFET transistor in the saturation state. By limiting the current value the MOSFET can obtain, a chaotic function is achieved. Specifically, the drain current, $I_D$, in saturation of a MOSFET transistor has an expression of the form $$I_D=K(Vgs-Vt)^2, \quad (7)$$

where K is a constant depending on device size and transistor processing characteristics and has units of $\mu A/V^2$, Vgs is the gate to source voltage of the transistor, and Vt is the strong inversion threshold voltage of the transistor. As in U.S. Pat. No. 7,096,437, the function is second order where x is replaced by Vgs. To show the function may take on chaotic behavior, consider the case where K=4, Vt=0.5 and the function is limited to a value of 0.75. This function, when performed by an n-channel and p-channel device in parallel as shown in FIG. 5 would be symmetric about the threshold voltage. A common summing point for each MOSFET device is used to combine the individual MOSFET currents together to create the final network. As can be seen with reference to the logistic mapping circuit of FIG. 5, the transistors M1 and M2 form the logistic mapping network that replicates the chaotic iterates. Currents 111 and 121 are fixed current sources which limit the total current the devices pass, hence providing the limiting function required of the chaotic function. M3 and M4 form a current mirror which acts as a summing point for the drain and source currents M1 and M2 respectively. The logistic map is symmetric around the value of the transistor threshold value, including input levels of Vdd (CMOS logic level 1) and ground (CMOS logic level 0).

It should be noted that, while it is necessary to have at least one non-linear element to implement a chaotic function, the reverse is not always true. That is, a non-linear function does not have to use or implement a chaotic function. Accordingly, the term "non-linear" includes chaotic functionality and implementations. Whereas the term "chaotic" as used herein is only one example of a non-linear function.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts that would be recognized by one skilled in the art are intended to be within the scope of the claims.

What is claimed is:

1. A method of compressing data, comprising:
identifying a single chaotic system that produces a desired output sequence of data corresponding to a data set being stored, the single chaotic system being an appropriate compression unit for the data set being stored, wherein identifying the single chaotic system that produces the desired output sequence of data corresponding to the data set being stored comprises:
forming a chain of controlled nonlinear systems, each nonlinear system representing a data segment of the desired output sequence of data;
initializing a candidate chaotic system;
connecting the candidate chaotic system to the chain of controlled nonlinear systems;
determining whether or not the output of the candidate chaotic system matches, using a dynamical search technique, the data segments of the chain of controlled nonlinear systems, in sequence over consecutive time intervals; and
when the candidate chaotic system is determined to match, identifying that candidate chaotic system as the single chaotic system;
when the candidate chaotic system is determined to not match, re-initializing the candidate chaotic system or initializing a different candidate chaotic system for performing the determining of whether or not the output of that candidate chaotic system matches.

2. The method of claim 1, wherein each of the nonlinear systems are held at an initial condition complementary to a desired output state of the single chaotic system.

3. The method of claim 2, further comprising applying a signal to each of the nonlinear systems to achieve the initial condition complementary to the desired output state, the signal setting a threshold value that confines the corresponding nonlinear system on a fixed point that encodes the data segment for its position in the desired output sequence of the data.

4. The method of claim 1, wherein initializing the candidate chaotic system comprises selecting a point in time or space from which an output of the chaotic system is to be used.

5. The method of claim 1, wherein the determining of whether or not the output of the candidate chaotic system matches, using the dynamical search technique, the data segments of the chained of controlled nonlinear systems, in sequence over consecutive time intervals, comprises:

receiving, at a first controlled nonlinear system of the chain of controlled nonlinear systems, the output of the candidate chaotic system from a first time interval;

adding the output of the candidate chaotic system to a state of the first nonlinear system to generate an added value;

evaluating an output condition of the first nonlinear system, wherein the output condition is a maximal value when the added value is equal to a pivot point of the first nonlinear system;

if the output condition is not at the maximal value, the candidate chaotic system is determined to not match; and if the output condition is at the maximal value:

switching the state of the first nonlinear system to a 0 state;

receiving, at the first nonlinear system of the chain of controlled nonlinear systems, the output of the candidate chaotic system from a second time interval;

receiving, at the second nonlinear system of the chain of controlled nonlinear systems, the output condition from the first nonlinear system, which is the output of the candidate chaotic system from the second time interval;

adding the output of the candidate chaotic system to a state of the second nonlinear system to generate a second added value;

evaluating a second output condition of the second nonlinear system, wherein the second output condition is a maximal value when the second added value is equal to a pivot point of the second nonlinear system;

if the output condition is not at the maximal value, the candidate chaotic system is determined to not match; and if the output condition is at the maximal value:

switching the state of the second nonlinear system to a 0 state; and repeating the dynamical search technique for each remaining nonlinear system of the chain of controlled nonlinear systems in sequence over consecutive time intervals, wherein if a final output condition of a last nonlinear system of the chain of nonlinear systems is at a maximal value for the last nonlinear system, the candidate chaotic system is determined to match.

6. A system for identifying a compression unit, the system comprising:

a chain of controlled nonlinear systems, each nonlinear system representing a data segment of a desired output sequence of data, wherein each controlled nonlinear system of the chain of controlled nonlinear systems comprises:

a nonlinear dynamical element; and a controller, wherein the controller comprises:

processing circuitry for encoding the nonlinear dynamical element with an appropriate program input for the data segment of the desired output sequence data;

a signal source that generates a value encoding the appropriate program input that is output from the circuitry; and a control switch for switching a state control for the nonlinear dynamical element between a 0 state and the value encoding the appropriate program input;

wherein the controller is configured to receive an output of a compression unit, add the output of the compression unit to the state control for the nonlinear dynamical element, receive an output of the nonlinear dynamical element, and control the control switch according to the output of the nonlinear dynamical element.

7. The system of claim 6, wherein the controller further comprises a threshold-response-triggered detector that controls the control switch and is triggered to switch the control switch from the value encoding the appropriate program input to the 0 state upon detecting an output condition of a maximal value from the output of the nonlinear dynamical element.

8. The system of claim 6, wherein the processing circuitry is configured to:

compute a variable r by computing $$r = \frac{1}{2} \cdot \frac{1}{I_{max} + 1},$$

where $I_{max}$ is a maximum integer;

create a lookup map that connects received program input values of z within a range of $[1, I_{max}]$ to threshold values $x^*_z$ of the interval $(0, \frac{1}{2})$ that encode the program input values of according to $x^*_z = z \cdot r$; and based on a program input value of the appropriate program input for the data segment received at the controller, identify an appropriate threshold value to be generated by the signal source as the value encoding the appropriate program input.

9. The system of claim 6, wherein the nonlinear dynamical element comprises a chaotic logic gate.

10. The system of claim 9, wherein the nonlinear dynamical element comprises a logistic map circuit.

* * * * *